(12) United States Patent
Deng et al.

(10) Patent No.: US 9,798,167 B2
(45) Date of Patent: Oct. 24, 2017

(54) ALIGNMENT SYSTEM

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Chaoyang Deng, Beijing (CN); Zijin Lin, Beijing (CN); Haisheng Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 335 days.

(21) Appl. No.: 14/387,379

(22) PCT Filed: Nov. 19, 2013

(86) PCT No.: PCT/CN2013/087428
§ 371 (c)(1),
(2) Date: Sep. 23, 2014

(87) PCT Pub. No.: WO2015/010396
PCT Pub. Date: Jan. 29, 2015

(65) Prior Publication Data
US 2016/0252753 A1    Sep. 1, 2016

(30) Foreign Application Priority Data

Jul. 24, 2013 (CN) .......................... 2013 1 0314015

(51) Int. Cl.
G02F 1/13 (2006.01)
G02F 1/1333 (2006.01)
(Continued)

(52) U.S. Cl.
CPC ........ G02F 1/1303 (2013.01); G03F 7/70358 (2013.01); G03F 7/70775 (2013.01);
(Continued)

(58) Field of Classification Search
CPC ........ G03F 9/7065; G03F 9/7049; G03F 9/70; G03F 9/7084; G03F 9/7076; G03F 7/70775; G03F 7/7085; G03F 7/70358
(Continued)

(56) References Cited

U.S. PATENT DOCUMENTS 4,643,579 A   2/1987   Toriumi et al.
4,668,089 A * 5/1987   Oshida .................. G03F 9/7049
                                                            250/202
(Continued)

FOREIGN PATENT DOCUMENTS

CN    102318078 A   1/2012
JP    2002-265040 A  9/2002

OTHER PUBLICATIONS

International Search Report Appln. No. PCT/CN2013/087428; Dated Apr. 18, 2014.
(Continued)

*Primary Examiner* — Monica Carter
*Assistant Examiner* — Seahee Yoon
(74) *Attorney, Agent, or Firm* — Ladas & Parry LLP; Loren K. Thompson

(57) ABSTRACT

An alignment system includes: a light emitting device located on one side of an object to be aligned for emitting light towards the object to be aligned; a light receiving device located on the other side of the object to be aligned and at a standard position corresponding to an alignment mark disposed on the object to be aligned, the light receiving device being provided with a plurality of light sensors for sensing light emitting from the light emitting device on an (Continued)

end surface facing the object to be aligned; a processor configured to receive sensing signals transmitted from each of the light sensors and determine whether the object to be aligned is aligned accurately according to whether each of the light sensors sense the light emitted from the light emitting device. This alignment system shortens the processing time and enhances the processing efficiency.

12 Claims, 5 Drawing Sheets

(51) Int. Cl.
  *G03F 9/00* (2006.01)
  *G03F 7/20* (2006.01)
(52) U.S. Cl.
  CPC .............. *G03F 9/00* (2013.01); *G03F 9/70* (2013.01); *G03F 9/7049* (2013.01); *G03F 9/7076* (2013.01); *G03F 9/7088* (2013.01); *G02F 2001/133354* (2013.01); *G02F 2001/133374* (2013.01)
(58) Field of Classification Search
  USPC ............... 356/485, 490, 508, 363, 138, 139, 356/139.04, 139.08, 153, 399; 29/25.01, 29/714, 740
  See application file for complete search history.

(56) References Cited

U.S. PATENT DOCUMENTS

| | | | | |
|---|---|---|---|---|
| 4,811,062 A * | 3/1989 | Tabata | ............... | G03F 9/7049 250/342 |
| 4,848,911 A * | 7/1989 | Uchida | ............... | G03F 9/7049 257/797 |
| 5,682,243 A * | 10/1997 | Nishi | ............... | G03F 9/70 356/401 |
| 5,812,271 A * | 9/1998 | Kim | ............... | G03F 9/70 356/401 |
| 5,907,405 A * | 5/1999 | Mizutani | ............... | G03F 7/70425 356/399 |
| 6,529,625 B2 * | 3/2003 | Sentoku | ............... | G03F 7/70775 250/559.3 |
| 7,095,483 B2 * | 8/2006 | Daniel | ............... | H01L 23/544 257/E23.179 |
| 7,809,278 B2 * | 10/2010 | Morris | ............... | H04B 10/1143 398/129 |
| 7,911,561 B2 * | 3/2011 | Seok | ............... | G02F 1/1347 349/187 |
| 9,297,642 B2 * | 3/2016 | Hashimoto | ............... | G03F 9/00 |
| 2002/0043344 A1 | 4/2002 | Watanabe et al. | | |
| 2008/0273159 A1 | 11/2008 | Seok et al. | | |
| 2012/0040490 A1 | 2/2012 | Gallazzo et al. | | |
| 2014/0022377 A1 * | 1/2014 | Kanaya | ............... | G03F 7/70775 348/95 |
| 2014/0168627 A1 * | 6/2014 | Schmitt-Weaver | ..... | G03F 7/707 355/77 |
| 2015/0205564 A1 * | 7/2015 | Xu | ............... | G06F 3/1446 428/195.1 |

OTHER PUBLICATIONS

International Search Report and Written Opinion both dated May 12, 2014; PCT/CN2013/087428.

First Chinese Office Action Appln. No. 201310314015.0; Dated Jun. 3, 2015.

International Preliminary Report on Patentability Appln. No. PCT/CN2013/087428; Dated Jan. 26, 2016.

* cited by examiner

ALIGNMENT SYSTEM

TECHNICAL FIELD

Embodiments of the present invention relate to an alignment system.

BACKGROUND

Thin film transistor liquid crystal displays (TFT-LCDs) have become dominant in the present flat plate display market due to their advantages of small volume, low power consumption, and no irradiation, and are widely applied in desktop computers, notebook computers, personal digital assistants (PDA), mobile telephones, TV sets and monitors. The manufacturing process of a TFT-LCD can be divided into approximately the following three stages:

I. Array Process

Individual TFT pixel array circuits are formed on a glass substrate by a plurality of mask processes, with each pixel array area corresponding to one liquid crystal display (panel) to form an array substrate (TFT substrate).

II. Cell Process

Liquid crystal is dropped on the TFT substrate and is covered by a color filter substrate such that an LCD panel is formed, and the LCD panel is cut to form individual liquid crystal displays.

III. Module Process

A backlight source, optical films and peripheral circuits are mounted for each liquid crystal display so as to form a complete TFT-LCD display module.

When the glass substrate is put into the array process, with a bottom gate TFT-LCD as an example, the first manufacturing step is typically to manufacture gate electrodes and gate lines. The first manufacturing step also forms alignment marks at edges and corners of the glass substrate at the same time, and the alignment marks are typically formed into the shape of cross and made of a metal film, hence are opaque. Alignment marks on the array substrate play a critical role in the above three manufacturing stages. In each manufacturing step, it is generally required to hold the glass substrate onto an apparatus correspondingly for the step (such as a sputtering apparatus, a PECVD (Plasma Enhanced Chemical Vapor Deposition) apparatus, an exposure apparatus, a track machine (namely other apparatuses other than the exposure apparatus in the photolithography process)) so that the glass substrate can undergo corresponding operations such as film formation, exposure, etching and so on. However, since it is possible that the glass substrate deviates from its standard position (namely the position the glass substrate should be located at in the ideal state of a holding member without error) when the holding members of various apparatuses hold the glass substrate, before the glass substrate is subjected to the corresponding operations, the glass substrate needs to be aligned to check whether the glass substrate is well aligned.

At present, an approach used to align the alignment marks on the glass substrate is as follows: saving or keeping in advance a standard picture of alignment marks on the glass substrate while the glass substrate is in the standard position; and in the manufacturing process, comparing the currently-taken picture of alignment marks on the glass substrate with the pre-saved standard picture if alignment is desired. If the comparison result is consistency, it indicates the glass substrate is aligned accurately and the glass substrate is subjected to the corresponding operations; in case of in-consistency, it indicates the glass substrate is not aligned accurately.

In summary, the current alignment approach used in the manufacturing process liquid crystal display devices suffers from long processing time and low processing efficiency.

SUMMARY

Embodiments of the present invention provide an alignment system for addressing problems of the conventional alignment processing method such as long processing time and low processing efficiency.

An embodiment of the present invention provides an alignment system including a light emitting device, a light receiving device and a processor. The light emitting device is located on one side of an object to be aligned and emits light towards the object to be aligned. The light receiving device is located on the other side of the object to be aligned and at a standard position corresponding to an alignment mark disposed on the object to be aligned, the light receiving device is provided with a plurality of light sensors, configured for sensing the light, on an end surface facing the object to be aligned. The processor receives sensing signals transmitted from each of the light sensors and determines whether the object to be aligned is aligned accurately according to whether the light sensors sense the light.

For example, the processor determining whether the object to be aligned is aligned accurately includes: if at least one light sensors contained in the light receiving device fails to sense the light emitted from the light emitting device, the processor determines that the object to be aligned is not aligned accurately; if all light sensors contained in the light receiving device sense the light emitted from the light emitting device, the processor determines that the object to be aligned is aligned accurately.

Furthermore, for example, when it is determined that the object to be aligned is not aligned accurately, the processor further determines an alignment direction and an alignment distance for which the object to be aligned needs to be adjusted respectively according to positions and number of light sensors that fail to sense the light in the light receiving device, and the alignment distance comprises a horizon distance and a vertical distance.

Furthermore, for example, for at least two the alignment marks disposed on the object to be aligned, the processor determines whether the object to be aligned is rotated according to positions of light sensors that fail to sense light in the light receiving device corresponding to the two alignment marks; or, for the at least two alignment marks disposed on the object to be aligned, the processor determines a maximum horizontal distance and a maximum vertical distance corresponding to each of the alignment marks respectively and determines whether the object to be aligned is rotated according to the maximum horizontal distances and the maximum vertical distances corresponding to the two alignment marks.

Furthermore, for example, after determining the object to be aligned has been rotated, the processor determines the alignment angle according to a difference between maximum horizontal distances of the two alignment marks and a difference between maximum vertical distances of the two alignment marks; and the processor determines a compensation direction for the alignment angle according to positions of light sensors that fail to sense the light in the light receiving device corresponding to the two alignment marks; after compensating the object to be aligned according to the alignment angle and the compensation direction, for any of the alignment marks, the processor determines an alignment direction and an alignment distance for which the object to be aligned needs to be adjusted respectively according to positions and number of light sensors that fail to sense the light in the light receiving device.

For example, if the alignment mark is opaque, and periphery of the alignment mark is transparent, an end surface of the light receiving device that faces the alignment mark comprises a first region at a center and a second region adjacent to the first region, and the first region has a shape and a size same as that of the alignment marks; the second region consists of subregions disposed respectively around a rectangular region in which the first region is located, and all of the light sensors are uniformly distributed in the second region and any two of the light sensors are disposed equidistantly.

For example, a central light receiving device is disposed at a central position of the first region, if all light sensors contained in the light receiving device sense the light, and the central light receiving device contained in the light receiving device fails to sense the light, the processor determines that the object to be aligned is aligned accurately; if all light sensors contained in the light receiving device sense the light, and the central light receiving device contained in the light receiving device senses the light, the processor determines that the object to be aligned is not aligned accurately.

In the present implementation, the processor determines the alignment direction of the object to be aligned is the direction opposite to positions of light sensors that fail to sense the light emitted from the light emitting device in the light receiving device according to positions of light sensors that fail to sense the light in the light receiving device.

As another example, if the alignment mark is transparent, and periphery of the alignment mark is opaque, an end surface of the light receiving device that faces the alignment mark comprises a first region at a center, and the first region has a shape and a size same as that of the alignment marks; all of the light sensors are uniformly distributed in the first region and any two of the light sensors are disposed equidistantly.

In the present implementation, the processor determines an alignment direction and an alignment distance for which the object to be aligned is to be adjusted respectively according to positions and number of light sensors that fail to sense light in an outer region of a projection of a circumscribed rectangle of the alignment marks onto the light receiving device, and the alignment distance comprises a horizon distance and a vertical distance.

For example, the processor determines the alignment direction for the object to be aligned as a direction towards positions of light sensors that fail to sense the light emitted from the light emitting device in the light receiving device.

For example, the alignment system is applied in a manufacturing process of display devices, and the object to be aligned is a base substrate provided with an alignment mark in at least one corner region.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAIL DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An embodiment of the present invention can determine whether an object to be aligned is aligned accurately by simply determining whether a light sensor contained in a light receiving device senses light emitted from a light emitting device, thereby shortening the alignment processing time and improving the alignment processing efficiency.

Figure 1:
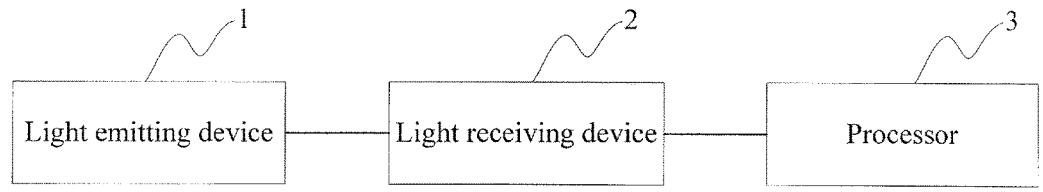
FIG. 1 is a structure diagram of an alignment system provided in an embodiment of the present invention.

As shown in FIG. 1, an embodiment of the present invention provides an alignment system including a light emitting device 1, a light receiving device 2 and a processor 3.

While an object to be aligned is during alignment processing, the light emitting device 1 is located on one side of the object to be aligned and emits light towards the object to be aligned; the light receiving device 2 is located on the opposite side of the object to be aligned and at a standard position corresponding to alignment marks disposed on the object to be aligned, and is provided with a plurality of light sensors for sensing light emitted by the light emitting device 1 on an end surface facing the object to be aligned; and the processor 3 receives sensing signals transmitted by each light sensor and determines whether the object to be aligned is aligned accurately depending on whether each light sensor senses light emitted from the light emitting device 1.

For example, for any one light sensor in the light receiving device, if the light sensor senses light emitted from the light emitting device (that is, the light sensor receives light emitted from the light emitting device), the light sensor transmits a sensing signal indicating that it has sensed the light emitted from the light emitting device; if the light sensor fails to senses the light emitted from the light emitting device (that is, the light sensor does not receive the light emitted from the light emitting device), the light sensor transmits a sensing signal indicating that it has not sensed the light emitted from the light emitting device.

In embodiments of the present invention, a standard position corresponding to the object to be aligned (also referred to as an ideal position) refers to the position where the object to be aligned is located while being held under a ideal condition in which the holding member of an apparatus has no error. Furthermore, a standard position corresponding to an alignment mark on the object to be aligned (also referred to as an ideal positions) refer to the position where the alignment mark is located on the object to be aligned when the object to be aligned is located at its standard position. However, since the holding member of an equipment may suffer from a minute error (typically on the order of microns) when conducting each holding act, which is not intolerable in the manufacturing process. It is required to align the alignment marks to further eliminate difference between the position of the object to be aligned and the standard position (namely ideal position), ensuring that a pattern manufactured on the object to be aligned with the present apparatus can match the patterns manufactured on the object to be aligned in the previous manufacturing process(es).

In embodiments of the present invention, while the object to be aligned is in alignment processing, the light emitting device on one side of the object to be aligned emits light towards the object to be aligned, while the light receiving device located on the other side of the object to be aligned and at the standard position corresponding to the alignment marks disposed on the object to be aligned senses the light emitted from the light emitting device. It is determined whether the object to be aligned is aligned accurately depending on whether light sensors contained in the light receiving device senses the light emitted from the light emitting device. Embodiments of the present invention can determine whether an object to be aligned is aligned accurately by simply determining whether a light sensor contained in a light receiving device senses light emitted from a light emitting device, and therefore the alignment processing time is shortened and the alignment processing efficiency is improved.

It is to be noted that in embodiments of the present invention, the light emitting device and the light receiving device are disposed on two sides of the object to be aligned respectively, and the light emitting device may be disposed at an arbitrary position on one side of the object to be aligned; because it is required to determine whether the object to be aligned is aligned accurately depending on whether light sensors contained in the light receiving device sense the light, the light receiving device needs to be disposed on the other side of the object to be aligned and located at the standard position corresponding to alignment marks provided on the object to be aligned.

Preferably, the light emitting device and the light receiving device may be located on the two sides of the object to be aligned respectively and the position of the light emitting device corresponds to the position of the light receiving device, that is, the light emitting device and the light receiving device are disposed on two sides of the alignment mark(s) of the object to be aligned respectively.

Furthermore, if at least two alignment marks are disposed on the object to be aligned, the light receiving device according to embodiments of the present invention can further be moved from a standard position corresponding to one alignment mark to a standard position corresponding to another alignment mark, such that the object to be aligned is aligned based on different alignment marks.

It is to be noted that in embodiments of the present invention, the shape of an alignment mark is not limited and the alignment marks may be of an arbitrary shape such as cross, triangle, circle, polygon, etc.

In embodiments of the present invention, the kinds of light sensors are not limited. Any sensor device that can sense the light emitted from the light emitting device can be used as the light sensor(s) in embodiments of the present invention. For example, It is possible to select parameter information such as types (for example, selecting charge coupled devices (CCDs) as the light sensors), sizes and resolutions of the light sensors and determine the spacing between any two adjacent light sensors in the arrangement of the light emitting device according to alignment precision of the object to be aligned (such as micron order alignment precision or millimeter order alignment precision etc.).

In practice, the following two cases may be included for the processor to determine whether the object to be aligned is aligned accurately:

(1) If at least one light sensors contained in the light receiving device fails to sense the light emitted from the light emitting device, the processor determines that the object to be aligned is not aligned accurately; and (2) If all light sensors contained in the light receiving device sense the light emitted from the light emitting device, the processor determines that the object to be aligned is aligned accurately.

Furthermore, when the processor determines that the object to be aligned is not aligned accurately, the processor further determines an alignment direction and an alignment distance for which the object to be aligned is to be adjusted respectively according to the position and the number of light sensors that fail to sense light in the light receiving device. The alignment distance includes a horizontal distance and a vertical distance.

For example, the processor may further determine how long is the distance the object to be aligned needs to be moved in the horizontal direction (leftwards or rightwards) and/or how long is the distance the object needs to be moved in the vertical direction (upwards or downwards) to allow the object to be aligned to be located at its corresponding standard position according to positions and number of light sensors in the light receiving device that fail to sense light.

In embodiments of the present invention, in the alignment processing, the object to be aligned might deflect, that is, there is a certain rotating angle from its corresponding standard position, which typically has a small value (generally within 1°). Then the following treatments are possible.

(1) If ifs only required to detect whether the object to be aligned is aligned accurately, it is possible to dispose only one alignment mark on the object to be aligned such that it's possible to determine whether the object to be aligned is aligned accurately.

(2) If it's required to determine the distances that the object to be aligned needs to be adjusted in the horizontal and vertical directions, and there is no rotating angle between the object to be aligned and its corresponding standard position, or the required precision for the rotating parameter of the object to be aligned is low (that is, the rotating parameter of the object to be aligned may be neglected), it is possible to dispose one alignment mark on the object to be aligned for alignment processing. For example, when it is determined that the object to be aligned is not aligned accurately, the processor further determines an alignment direction and an alignment distance for which the object to be aligned is to be adjusted respectively according to the position and the number of light sensors that fail to sense light in the light receiving device.

(3) If it's required to both consider whether the object to be aligned is rotated and consider the shifting in horizontal and vertical directions of the object to be aligned, the processor needs to first determine whether the object to be aligned has been rotated; then after determining that the object to be aligned has been rotated, the processor determines an alignment angle (that is the angle by which the object to be aligned need to be rotated) and a compensation direction (for compensating towards a direction opposite to the direction in which the object to be aligned needs to be rotated); subsequently, after the object to be aligned is compensated according to the alignment angle and the compensation direction, the processor further determines a distance it needs to be adjusted in the horizontal direction (namely how long is the distance to be moved in the horizontal direction leftwards or rightwards) and a distance it needs to be adjusted in the vertical direction (namely how long is the distance to be moved in the vertical direction upwards or downwards).

In practice, there may be the following methods for example for the processor to determine whether the object to be aligned is rotated:

(Method 1) For at least two alignment marks disposed on the object to be aligned, the processor determines whether the object to be aligned is rotated according to positions of light sensors that fail to sense light in the light receiving device corresponding to the two alignment marks. For example, if the positions of the light sensors that fail to sense light in the light receiving device corresponding to the two alignment marks are the same, the processor determines that the object to be aligned has not been rotated; if the positions of the light sensors that fail to sense light in the light receiving device corresponding to the two alignment marks are different, the processor determines that the object to be aligned has been rotated.

(Method 2) For at least two alignment marks disposed on the object to be aligned, the processor determines a maximum horizontal distance and a maximum vertical distance corresponding to each alignment mark respectively and determines whether the object to be aligned is rotated according to the maximum horizontal distances and the maximum vertical distances corresponding to the two alignment marks. For example, if the maximum horizontal distances corresponding to the two alignment marks are equal to each other, and the maximum vertical distances corresponding to the two alignment marks are equal to each other, the processor determines that the object to be aligned has not been rotated; if the maximum horizontal distances corresponding to the two alignment marks are not equal, or the maximum vertical distances corresponding to the two alignment marks are not equal, the processor determines that the object to be aligned has been rotated.

In practice, specific examples of alignment processing by the processor include the following examples.

For at least two alignment marks disposed on the object to be aligned, the processor determines an alignment angle according to the difference between maximum horizontal distances of the two alignment marks and the difference between maximum vertical distances of the two alignment marks. Further, the processor determines a compensation direction (namely clockwise or anti-clockwise compensation) for this alignment angle according to positions of light sensors that fail to sense light in the light receiving device corresponding to the two alignment marks. After compensating for the object to be aligned according to the alignment angle and its compensation direction, for any alignment mark, the processor determines an alignment direction and an alignment distance for which the object to be aligned needs to be adjusted respectively according to the position and the number of light sensors that fail to sense light in the light receiving device.

For example, the processor determines an alignment angle for the object to be aligned according to formula 1:

$$tg\theta = \frac{\Delta H}{\Delta V} \qquad \text{Formular 1}$$

Where $\theta$ is the alignment angle for the object to be aligned, $\Delta H$ is the difference between the maximum horizontal distances of the two alignment marks, $\Delta V$ is the difference between the maximum vertical distances of the two alignment marks.

In practice, a specific example of compensating the object to be aligned according to the determined alignment angle includes: adjusting the object to be aligned (namely rotating the object to be aligned clockwise or anticlockwise) according to the determined alignment angle and its compensation direction, to eliminate the angular discrepancy between the current position of the object to be aligned and its standard position or make the angular discrepancy within an allowable range.

As a preferred application scenario, the alignment system provided in embodiments of the present invention can be applied in the manufacturing process of display devices. Then, the object to be aligned is a base substrate with alignment marks disposed in at least one corner regions of the base substrate. Of course, the alignment system provided in embodiments of the present invention is also applicable to other scenarios that require alignment processing.

If the alignment system in embodiments of the present invention is applicable to the manufacturing process of the display device, as a preferable example, the alignment marks disposed on the base substrate are cross alignment marks. Of course, the alignment marks may also be of another shape such as triangle, circle, rectangle, polygon etc.

In practice, the light receiving device in embodiments of the present invention may contain a plurality of light sensors, and the arrangement of the plurality of light sensors on the end surface facing the alignment marks of the light receiving device is relevant to whether the alignment marks on the object to be aligned is transparent and to the shape of the alignment marks. The following two preferable examples are included:

Scheme I: if an alignment mark on the object to be aligned is opaque while the periphery of the alignment mark is transparent, the end surface of the light receiving device that faces the alignment mark includes a first region at the center and a second region adjacent to the first region. The shape and size of the first region are the same as that of the alignment mark disposed on the object to be aligned, and the second region is formed of subregions respectively disposed around the rectangular region where the first region is located. All the light sensors are uniformly distributed in the second region and any two light sensors are disposed equidistantly.

Figure 2A:
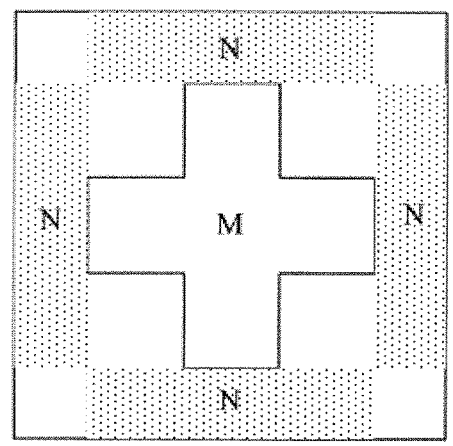
FIG. 2A is a schematic diagram of a distribution of a plurality of light sensors in scheme I provided in an embodiment of the present invention.

As an example, alignment marks of cross shape will be described below, and the description about alignment marks of another shape are similar and will not be conducted in detail one by one herein. Structures of the first region M and the second region N in the end surface of the light receiving device that faces the alignment mark are shown in FIG. 2A. In FIG. 2A, the shape and size of the first region M are the same as that of the alignment mark disposed on the object to be aligned, and the second region N consists of subregions respectively disposed around the rectangular region where the first region M is located. All the light sensors are uniformly distributed in the second region N and any two light sensors are disposed equidistantly.

In this scheme, if at least one light sensors contained in the light receiving device fails to sense the light emitted from the light emitting device, the processor determines that the object to be aligned is not aligned accurately; if all light sensors contained in the light receiving device sense the light emitted from the light emitting device, the processor determines that the object to be aligned is aligned accurately.

In this way, if the processor determines that the object to be aligned is not aligned accurately, the processor determines the direction and the position in which the object to be aligned needs to be adjusted according to the corresponding processing mode for different application scenarios.

First application scenario. In this case, in the alignment processing, the processor only needs to consider the shifting in the horizontal and vertical directions of the object to be aligned.

In this application scenario, in the alignment processing, the object to be aligned may contain only one alignment mark, the light emitting device is located on the side of the alignment mark, and emits light towards the alignment mark, the light receiving device is located on the other side of the alignment mark and at the standard position corresponding to the alignment mark, and the processor determines the alignment direction and the alignment distance for which the object to be aligned needs to be adjusted respectively according to the position and the number of light sensors that fail to sense light emitted by the light emitting device in the light receiving device. The alignment distance includes a horizontal distance and a vertical distance.

In practice, the processor determines that the alignment direction in which the object to be aligned needs to be adjusted is the direction opposite to positions of the light sensor(s) that fail to sense the light emitted from the light emitting device in the light receiving device according to the position and the number of light sensors that fail to sense light in the light receiving device.

For example, in the horizontal direction, if a light sensor in the left region fail to sense the light emitted from the light emitting device, the determined alignment direction is rightwards, that is, the object to be aligned needs to be adjusted rightwards; if a light sensor in the right region fail to sense the light emitted from the light emitting device, the determined alignment direction is leftwards, that is, the object to be aligned needs to be adjusted leftwards.

In the vertical direction, if a light sensor in the upper region fail to sense the light emitted from the light emitting device, the determined alignment direction is downwards, that is, the object to be aligned needs to be adjusted downwards; if a light sensor in the bottom region fail to sense the light emitted from the light emitting device, the determined alignment direction is upwards, that is, the object to be aligned needs to be adjusted upwards.

In practice, the processor determines the alignment distance for which the object to be aligned needs to be adjusted according to a preset correspondence relationship between the number of light sensors that fail to sense light and the alignment distance.

Specifically, the correspondence relationship may be the correspondence relationship between the total number of light sensors that fail to sense light in any subregion of the second region and the alignment distance. Specifically, the correspondence relationship may also be the correspondence relationship between the number of rows (or columns) occupied by light sensors that fail to sense light in any subregion of the second region and the alignment distance. For example, light sensors that fail to sense light in left subregions in the second region occupy three columns, then the corresponding alignment distance is two column spacings. As another example, light sensors that fail to sense light in upper subregions in the second region occupy two rows, then the corresponding alignment distance is one row spacing.

In practice, for example, the correspondence relationship is the correspondence relationship between the number of rows M (or the number of columns N) occupied by light sensors that fail to sense light in any subregion of the second region and the alignment distance, and then the determined alignment distance is M−1 row spacings (or N−1 column spacings).

Figure 2B:
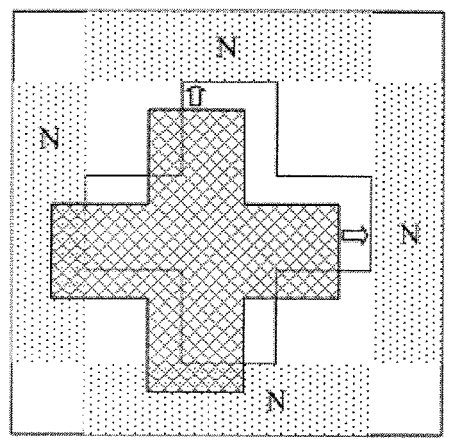
FIG. 2B is a schematic diagram of an relative position between alignment marks and a light receiving device in scheme I provided in an embodiment of the present invention.

For example, if relative positions of alignment marks on the current object to be aligned and the light receiving device are as shown in FIG. 2B, a part of light sensors contained in a left subregion in the second region of the light receiving device fail to sense the light emitted from the light emitting device, and a part of light sensors contained in a bottom subregion fail to sense the light emitted from the light emitting device, the determined alignment directions are shown by the arrows in FIG. 2B, and are the directions opposite to the positions of light sensors that fail to sense the light emitted from the light emitting device in the light receiving device, that is, it is required to compensate the object to be aligned rightwards and upwards to allow the object to be aligned to be located at its corresponding standard position.

In practice, the processor may determine the alignment distance to be adjusted according to a preset correspondence relationship between the number of light sensors that fail to sense light and the alignment distance. In FIG. 2B, assuming that there are 7 columns of light sensors that fail to sense the light emitted from the light emitting device in the left subregion in the second region of the light receiving device, it is determined the alignment distance in the horizontal direction is 6 column spacings and an alignment distance of 6 column spacings are needed to compensate rightwards in connection with the alignment direction. In FIG. 2B, assuming that there are 5 rows of light sensors that fail to sense the light emitted from the light emitting device in the bottom subregion in the second region of the light receiving device, it is determined the alignment distance in vertical direction is 4 row spacings and an alignment distance of 4 row spacings are needed to compensate upwards in connection with the alignment direction.

Figure 2C:
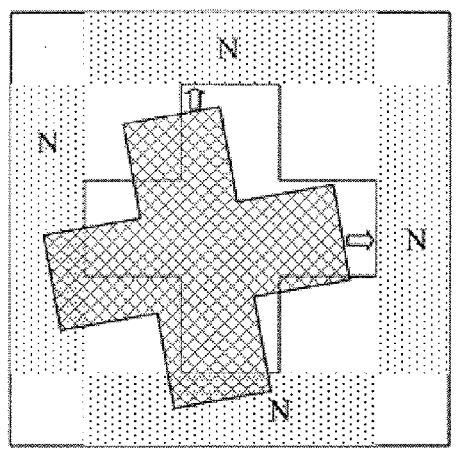
FIG. 2C is a schematic diagram of another relative position between alignment marks and a light receiving device in scheme I provided in an embodiment of the present invention.

Second application scenario. Here, in the alignment processing, the processor needs to consider the alignment angle of the object to be aligned, namely needs to consider whether the object to be aligned has been rotated by an angle. If the object to be aligned has been rotated by a certain angle, any alignment mark on the object to be aligned will undergo an angular deflection as shown in FIG. 2C.

In this application scenario, in alignment processing, according to the at least two alignment marks disposed on the object to be aligned, with the above-mentioned method 1 or method 2, it is determined whether the object to be aligned is rotated, and if it is rotated, the corresponding alignment angle and compensation direction are further determined. After compensating the object to be aligned according to the alignment angle and its compensation direction, alignment distances and alignment directions in the horizontal direction and the vertical direction are determined further according to the processing approach in the first application scenario in the present embodiment.

For example, in the alignment processing, the light receiving device is first placed at a standard position corresponding to any alignment mark disposed on the object to be aligned, to determine the position and the number of light sensors that fail to sense light in the light receiving device. Then, the light receiving device is moved to a standard position corresponding to another alignment mark according to the relative position relationship between the two alignment marks to determine the position and the number of light sensors that fail to sense light in the light receiving device.

In practice, the processor determines a compensation direction of the alignment angle according to positions of light sensors that fail to sense light in the light receiving device corresponding to the two alignment marks. For example, when the light receiving device is located at the standard position corresponding to the first alignment mark, the processor determines positions of light sensors that fail to sense light in the light receiving device. When the light receiving device is located at the standard position corresponding to the second alignment mark, the processor determines positions of light sensors that fail to sense light in the light receiving device. The processor determines a direction (namely clockwise or anti-clockwise) in which the object to be aligned is rotated relative to the standard position corresponding to the object to be aligned according to positions of light sensors that fail to sense light in the light receiving device corresponding to the two alignment marks. Furthermore, the processor determines the direction opposite to the direction in which the object to be aligned is rotated relative to its corresponding standard position as the compensation direction of the alignment angle (if the rotating direction is clockwise, the compensation direction is anti-clockwise; and if the rotating direction is anti-clockwise, the compensation direction is clockwise).

It is to be noted that because the two alignment marks are disposed at different positions, the methods for determining compensation direction are different. Nevertheless the preset method may be followed so long as positions for disposing the two alignment marks are determined. The compensation direction of the alignment angle is determined according to positions of light sensors that fail to sense light in the light receiving device corresponding to the two alignment marks.

Figure 2D:
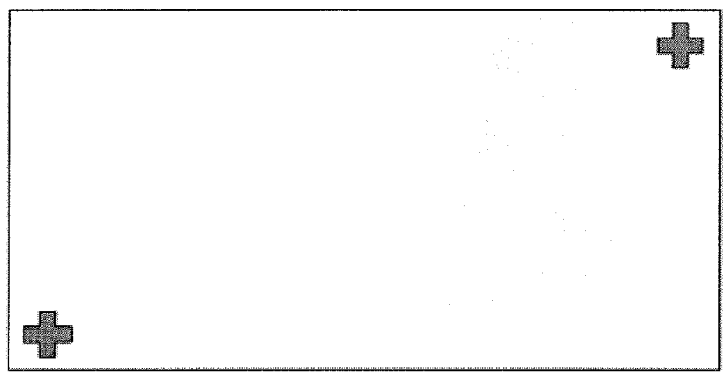
FIG. 2D is a schematic diagram of a first position of two alignment marks on an object to be aligned in scheme I provided in an embodiment of the present invention.

For example, it is assumed that the two alignment marks are located at diagonal positions of the object to be aligned respectively. For example, one alignment mark is disposed at the top right corner, the other is disposed at the bottom left corner, as shown in FIG. 2D, and in this case a specific example for the processor to determine the compensation direction of the alignment angle is as follows. If the processor determines that the left subregion (and/or upper subregion) in the light receiving device contain light sensors that fail to sense light according to the alignment mark at top right corner, and the processor determines that the right subregion (and/or bottom subregion) in the light receiving device contain light sensors that fail to sense light according to the alignment mark at bottom left corner, the processor determines the direction in which the object to be aligned is rotated is anti-clockwise. Furthermore, the processor determines the compensation direction is clockwise. If the processor determines that the right subregion (and/or bottom subregion) in the light receiving device contain light sensors that fail to sense light according to the alignment mark at top right corner, and the processor determines that the left subregion (and/or upper subregion) in the light receiving device contain light sensors that fail to sense light according to the alignment mark at bottom left corner, the processor determines the direction in which the object to be aligned is rotated is clockwise. Furthermore, the processor determines the compensation direction is anti-clockwise.

Figure 2E:
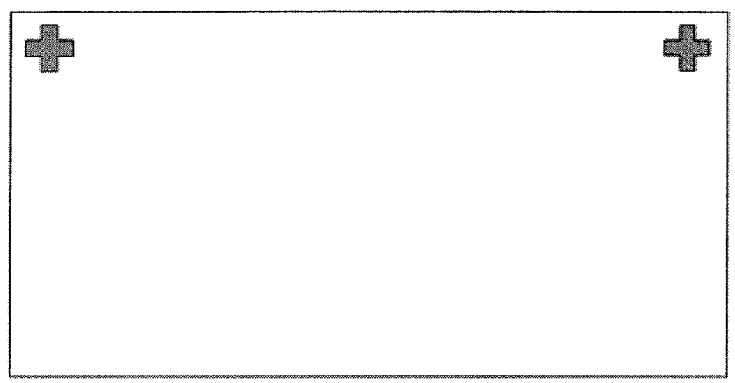
FIG. 2E is a schematic diagram of a second position of two alignment marks on an object to be aligned in scheme I provided in an embodiment of the present invention.

As another example, it is assumed that the two alignment marks are respectively located in two edge regions on the top side of the object to be aligned. For example, one alignment mark is disposed at the top left corner, the other is disposed at the top right corner, as shown in FIG. 2E, and in this case a specific example for the processor to determine the compensation direction of the alignment angle is as follows. If the processor determines that the bottom subregion in the light receiving device contains light sensors that fail to sense light according to the alignment mark at top left corner, and the processor determines that the top subregion in the light receiving device contains light sensors that fail to sense light according to the alignment mark at top right corner, the processor determines the direction in which the object to be aligned is rotated is anti-clockwise. Furthermore, the processor determines the compensation direction is clockwise. If the processor determines that the top subregion in the light receiving device contains light sensors that fail to sense light according to the alignment mark at top left corner, and the processor determines that the bottom subregion in the light receiving device contains light sensors that fail to sense light according to the alignment mark at top right corner, the processor determines the direction in which the object to be aligned is rotated is clockwise. Furthermore, the processor determines the compensation direction is anti-clockwise.

Figure 2F:
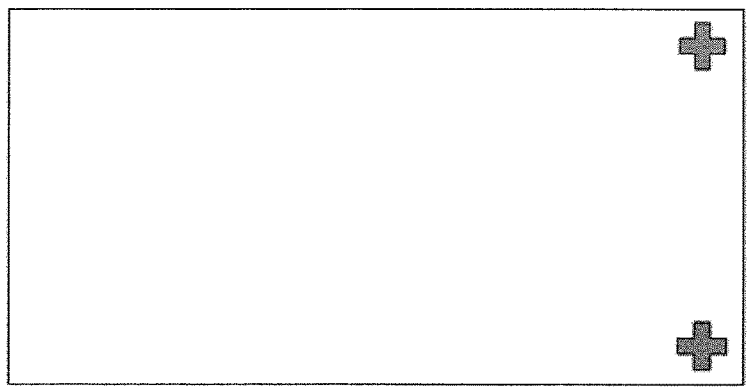
FIG. 2F is a schematic diagram of a third position of two alignment marks on an object to be aligned in scheme I provided in an embodiment of the present invention.

As further another example, it is assumed that the two alignment marks are respectively located in two edge regions on the right side of the object to be aligned. For example, one alignment mark is disposed at the top right corner, the other is disposed at the bottom right corner, as shown in FIG. 2F, and in this case a specific example for the processor to determine the compensation direction of the alignment angle is as follows. If the processor determines that the left subregion in the light receiving device contains light sensors that fail to sense light according to the alignment mark at top right corner, and the processor determines that the right subregion in the light receiving device contains light sensors that fail to sense light according to the alignment mark at bottom right corner, then the processor determines the direction in which the object to be aligned is rotated is anti-clockwise. Furthermore, the processor determines the compensation direction is clockwise. If the processor determines that the right subregion in the light receiving device contains light sensors that fail to sense light according to the alignment mark at top right corner, and the processor determines that the left subregion in the light receiving device contains light sensors that fail to sense light according to the alignment mark at bottom right corner, then the processor determines the direction in which the object to be aligned is rotated is clockwise. Furthermore, the processor determines the compensation direction is anti-clockwise.

Of course, the two alignment marks may also be disposed at other locations of the object to be aligned. For example, one alignment mark is disposed at the top left corner and the other at the lower right corner. As another example, one alignment mark is disposed at the top left corner and the other at the bottom left corner, etc. The processor can determines a compensation direction of the alignment angle of the object to be aligned according to positions of light sensors that fail to sense light in the light receiving device corresponding to the two alignment marks, which will not be described in detail one by one here.

Figure 2G:
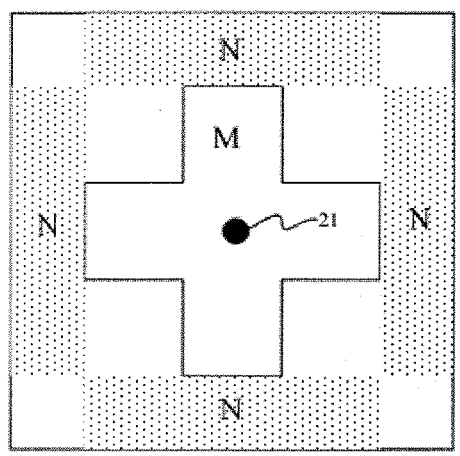
FIG. 2G is a schematic diagram of another preferred structure of an end surface of the light receiving device where the light sensors are located at in scheme I provided in an embodiment of the present invention.

In the present embodiment, preferably, as shown in FIG. 2G, a central light receiving device 21 is disposed at the central position of the first region M.

Accordingly, the processor may execute the following steps while determining whether the object to be aligned is aligned accurately: if all light sensors contained in the light receiving device sense the light emitted from the light emitting device, and the central light receiving device contained in the light receiving device fails to sense the light emitted from the light emitting device, it is determined that the object to be aligned is aligned accurately. If all light sensors contained in the light receiving device sense the light emitted from the light emitting device, and the central light receiving device contained in the light receiving device senses light emitted from the light emitting device, it is determined that the object to be aligned is not aligned accurately.

In an embodiment of the present invention, by providing a central light receiving device at the central position of the end surface of the light receiving device facing the object to be aligned, misjudgement is avoided when the object to be aligned is significantly shifted (for example, at present, alignment marks of the object to be aligned have already deviate from the light receiving device completely).

In the present embodiment, furthermore, there are the following compensation approaches in compensating the object to be aligned:

(Approach I) The object to be aligned is moved according to the determined alignment direction and alignment distance for compensation, and the alignment marks on the object to be aligned are located at their corresponding standard positions after regulation.

(Approach II) The operation that needs to be carried out for the object to be aligned is compensated according to the determined alignment direction and alignment distance.

If the object to be aligned experiences an angular deflection, a specific example of the above-mentioned approach I is as follows. The object to be aligned is rotated first according to the determined alignment angle and compensation direction. Then the object to be aligned is moved according to the determined alignment direction and alignment distance, and the alignment marks on the object to be aligned are located at their corresponding standard positions after regulation.

If the object to be aligned experiences an angular deflection, a specific example of the above-mentioned approach II is as follows. The object to be aligned is rotated first according to the determined alignment angle and compensation direction. Then the operation that needs to be carried out for the object to be aligned is compensated according to the determined alignment direction and alignment distance.

Considering an example in which the alignment system is applied in a display device manufacturing process and the object to be aligned is a base substrate, and assuming that the operation is the step of manufacturing an active layer on the base substrate, and before processing, the base substrate is aligned with the alignment system according to an embodiment of the present invention. If the processor determines that the base substrate is not aligned accurately, the alignment direction and the alignment distance required for the regulation of this operation are determined respectively, and compensation is made in the steps of manufacturing the active layer (masking, exposure, development, etching, and so on). That is to say, the mask is moved according to the determined alignment direction and alignment distance to avoid offsetting between the active layer manufactured in this step and the manufactured structures such as gate electrode and gate line, hence ensuring the relative position relationship between the active layer and the manufactured gate electrode and gate line.

It is to be noted that in this example, when the processor determines whether the object to be aligned is aligned accurately depending on whether each light sensor in the light receiving device senses the light emitted from the light transmitting device, if none of the light sensors contained in the light receiving device senses light (which is an abnormal condition), this indicates the alignment system fails or manufacturing of alignment marks of the object to be aligned has problems, in which case, the alignment system issues alarm signals to alert working personnel for debugging to remove the failure.

Scheme II: If an alignment mark disposed on the object to be aligned is transparent while the periphery of alignment mark is opaque, the end surface of the light receiving device that faces the alignment mark includes a first region at the center, which has a shape and a size same as that of the alignment mark. All light sensors are uniformly distributed in the first region and any two light sensors are disposed equidistantly.

Figure 3A:
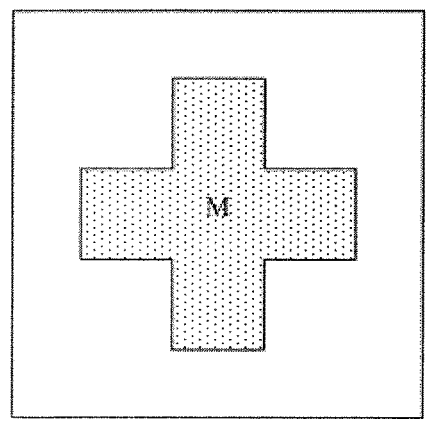
FIG. 3A is a schematic diagram of a distribution of a plurality of light sensors in scheme II provided in an embodiment of the present invention.

For example, considering an example in which the alignment mark has a cross shape, the structures of the first region M and the second region N in the end surface of the light receiving device facing the alignment mark are shown in FIG. 3A. In FIG. 3A, the shape and size of the first region M are the same as that of the alignment mark, all light sensors are uniformly distributed in the first region M and any two light sensors are disposed equidistantly.

In this way, if at least one light sensors contained in the light receiving device fails to sense the light emitted from the light emitting device, the processor determines that the object to be aligned is not aligned accurately: if all light sensors contained in the light receiving device sense the light emitted from the light emitting device, the processor determines that the object to be aligned is aligned accurately.

In this way, if the processor determines that the object to be aligned is not aligned accurately, the processor determines the direction and the position in which the object to be aligned needs to be adjusted according to the corresponding processing mode for different application scenarios.

First application scenario. Here, in the alignment processing, the processor only needs to consider the shifting in the horizontal and vertical directions of the object to be aligned.

In this application scenario, while in alignment processing, the object to be aligned can contain only one alignment mark. The light emitting device is located on one side of the alignment marks and emits light towards the alignment mark, and the light receiving device is located on the other side of the alignment mark and at the standard position corresponding to the alignment mark. The processor determines an alignment direction and an alignment distance for which the object to be aligned is to be adjusted respectively according to the position and the number of light sensors that fail to sense the light emitted from the light emitting device in the light receiving device. The alignment distance includes a horizontal distance and a vertical distance.

In practice, the processor determines the alignment direction and the alignment distance for which the object to be aligned is to be adjusted respectively according to the position and the number of light sensors that fail to sense light in outer region of the projection of a circumscribed rectangle of alignment marks onto the light receiving device. The alignment distance includes a horizontal distance and a vertical distance.

For example, the processor determines the alignment direction in which the object to be aligned needs to be adjusted is the direction towards the position of light sensors that fail to sense the light emitted from the light emitting device in the light receiving device.

Furthermore, in the present embodiment, the processor determines the alignment distance for which the object to be aligned needs to be adjusted according to a preset correspondence relationship between the number of light sensors that fail to sense light and the alignment distance.

For example, because the outer region of the projection of the circumscribed rectangle of the alignment mark onto the light receiving device includes four subregions, namely the upper, bottom, left and right subregions, the correspondence relationship may be the correspondence relationship between the total number of light sensors that fail to sense light in any subregion in the outer region and the alignment distance. The correspondence relationship may also be the correspondence relationship between the number of rows (or columns) occupied by light sensors that fail to sense light in any subregion of the outer region and the alignment distance.

In practice, for example, the correspondence relationship is the correspondence relationship between the number of rows M (or the number of columns N) occupied by light sensors that fail to sense light in any subregion of the outer region and the alignment distance, and thus the determined alignment distance is M−1 row spacings (or N−1 column spacings).

Figure 3B:
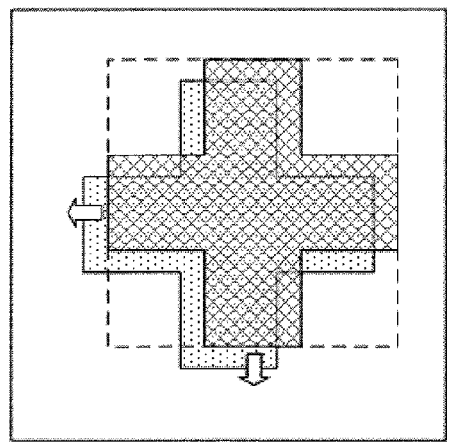
FIG. 3B is a schematic diagram of an relative position between alignment marks and a light receiving device in scheme II provided in an embodiment of the present invention.

For example, if the relative position of the alignment mark on the current object to be aligned and the light receiving device is as shown in FIG. 3B, in which the rectangle shown by broken line is the projection of the alignment mark in the light receiving device of which the outer region includes upper, bottom, left and right subregions, and a part of light sensors contained in the left subregion and the bottom subregion fail to sense the light emitted from the light emitting device, the determined alignment directions are shown by the arrows in FIG. 3B, and are the directions towards the positions of light sensors that fail to sense the light emitted from the light emitting device in the light receiving device, that is, it is required to compensate the object to be aligned leftwards and downwards.

In practice, the processor can determine the alignment distance to be adjusted according to a preset correspondence relationship between the number of light sensors that fail to sense light and the alignment distance. In FIG. 3B, assuming there are 4 columns of light sensors that fail to sense the light emitted from the light emitting device in the left subregion of the outer region of the projection of the circumscribed rectangle of alignment marks onto the light receiving device, it is determined the alignment distance in the horizontal direction is 3 column spacings and an alignment distance of 3 column spacings are needed to compensate leftwards in connection with the alignment direction. In FIG. 3B, assuming there are 5 rows of light sensors that fail to sense the light emitted from the light emitting device in the bottom subregions in the second region of the light receiving device, it is determined the alignment distance in vertical direction is 4 row spacings and an alignment distance of 4 row spacings are needed to compensate downwards in connection with the alignment direction.

Figure 3C:
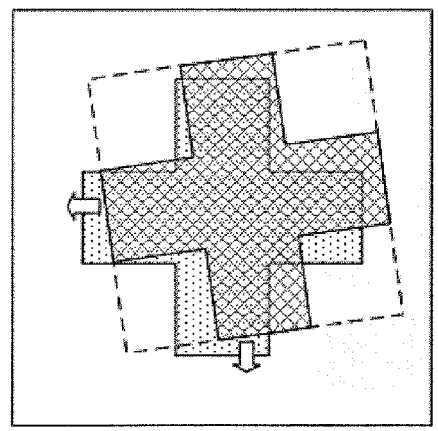
FIG. 3C is a schematic diagram of another relative position between alignment marks and a light receiving device in scheme II provided in an embodiment of the present invention.

Second application scenario. Here, in the alignment processing, the processor needs to consider the alignment angle of the object to be aligned, namely needs to consider whether the object to be aligned has been rotated by an angle. If the object to be aligned has been rotated by a certain angle, any alignment mark on the object to be aligned will undergo an angular deflection as shown in FIG. 3C.

In this application scenario, in alignment processing, according to the at least two alignment marks disposed on the object to be aligned, with the above-mentioned method 1 or method 2, it is determined whether the object to be aligned is rotated, and if it is rotated, corresponding alignment angle and compensation direction are further determined. After compensating the object to be aligned according to the alignment angle and its compensation direction, alignment distances and alignment directions in horizontal direction and vertical direction are determined further according to the processing approach under the first application scenario in the present embodiment.

For example, in the alignment processing, the light receiving device is first placed at a standard position corresponding to any alignment mark disposed on the object to be aligned, to determine the position and the number of light sensors that fail to sense light in the light receiving device. Then, the light receiving device is moved to a standard position corresponding to another alignment mark according to the relative position relationship between the two alignment marks to determine the position and the number of light sensors that fail to sense light in the light receiving device.

In practice, the processor determines the compensation direction of the alignment angle according to positions of light sensors that fail to sense light in the light receiving device corresponding to the two alignment marks, with specific examples as described below. When the light receiving device is located at the standard position corresponding to the first alignment mark, the processor determines positions of light sensors that fail to sense the light in the light receiving device. When the light receiving device is located at the standard position corresponding to the second alignment mark, the processor determines positions of light sensors that fail to sense light in the light receiving device. The processor determines the direction (namely clockwise or anti-clockwise) in which the object to be aligned is rotated relative to the standard position corresponding to the object to be aligned according to positions of light sensors that fail to sense light in the light receiving device corresponding to the two alignment marks. Furthermore, the processor determines the direction opposite to the direction in which the object to be aligned is rotated relative to its corresponding standard position is the compensation direction of the alignment angle (if the rotating direction is clockwise, the compensation direction is anti-clockwise; if the rotating direction is anti-clockwise, the compensation direction is clockwise).

It is to be noted that because the two alignment marks are disposed at different positions, the methods for determining compensation direction are different. Nevertheless the set method may be followed so long as positions for disposing the two alignment marks are determined. The compensation direction of the alignment angle is determined according to positions of light sensors that fail to sense light in the light receiving device corresponding to the two alignment marks. Because the method for determining the compensation direction of the alignment angle in the present scheme is similar to that in scheme I, it will not be described any more here.

It is to be noted that in this example, when the processor determines whether the object to be aligned is aligned accurately depending on whether each light sensor in the light receiving device senses the light emitted from the light transmitting device, if none of the light sensors contained in the light receiving device senses light (which is an abnormal condition), this indicates the alignment system fails or the manufacture of the alignment marks of the object to be aligned has problems, in which case, the alignment system issues alarm signals to alert working personnel for debugging to remove the failure.

Figure 4:
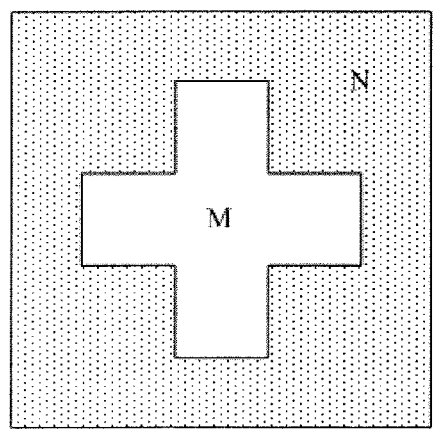
FIG. 4 is a schematic diagram of another distribution of a plurality of light sensors provided in an embodiment of the present invention.

It is to be noted that only two preferred embodiments of the embodiments of the present invention are given above, in embodiments of the present invention, the distribution of the plurality of light sensors contained in the light receiving device on the end surface facing the alignment marks may also be of other forms such as the distribution as shown in FIG. 4; the alignment mark on the object to be aligned is opaque and the periphery of the alignment mark is transparent, the end surface in the light receiving device that faces the alignment marks includes a first region M at the central position and a second region N adjacent to the first region. The shape and size of the first region M are the same as that of the alignment marks disposed on the object to be aligned, and the shape of the second region N is complementary to that of the first region M. All the light sensors are uniformly distributed in the second region and any two light sensors are disposed equidistantly.

As described in the background section, in the conventional alignment approach for alignment processing, there is low alignment precision and long processing time. In contrast, in embodiments of the present invention, while aligning the object to be aligned, the alignment direction and the alignment distance corresponding to the on-going operation are determined respectively according to the position and the number of light sensors that fail to sense the light emitted by the light emitting device in the light receiving device, thereby improving the alignment precision and shortening the processing time.

The structure of the alignment system according to embodiments of the present invention will be described in detail below with reference to the accompanying drawings and with respect to an example in which the alignment system provided in an embodiment of the present invention is applied in the manufacturing process of display devices.

Figure 5:
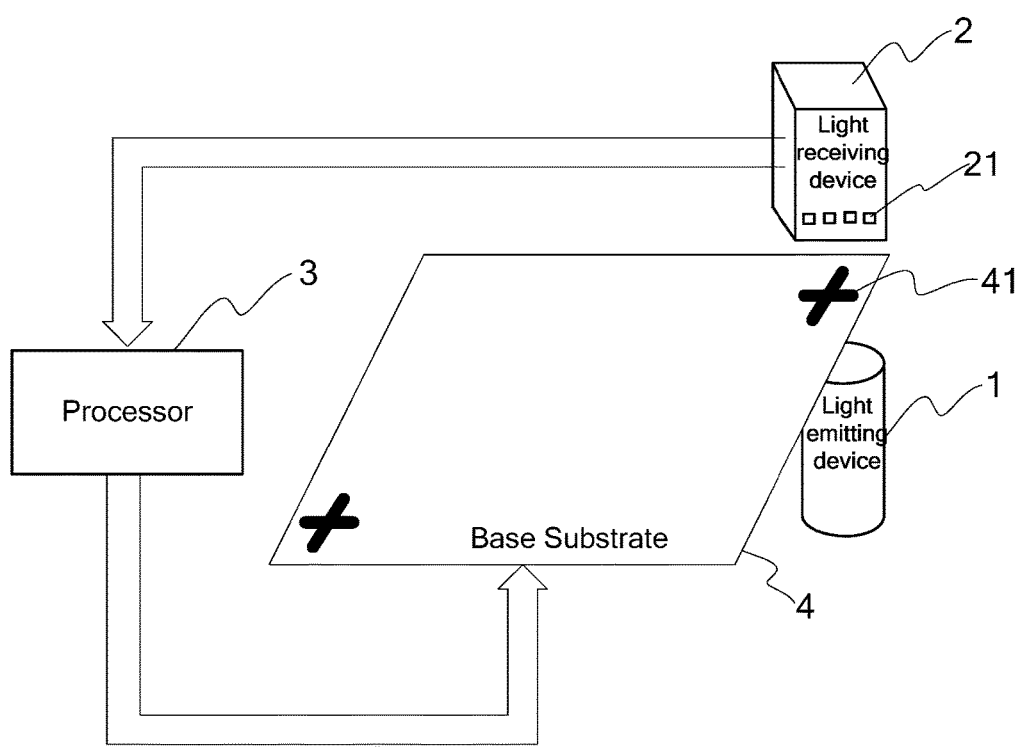
FIG. 5 is a schematic diagram of a preferred structure of the alignment system provided in embodiment of the present inventions while applied in a display device manufacturing process.

FIG. 5 shows a preferred example for the alignment system of embodiments of the present invention, which is however not a limitation to positions of devices in the system.

As shown in FIG. 5, an embodiment of the present invention provides an alignment system in a manufacturing process of display devices, including a light emitting device 1, a light receiving device 2 and a processor 3. The light emitting device 1 is located on one side of the base substrate 4 for emitting light towards the base substrate 1. The light receiving device 2 is located on the other side of the base substrate 4 and at the standard position corresponding to the alignment mark 41 disposed on the base substrate 4. The light receiving device 2 is provided with a plurality of light sensors on an end surface facing the base substrate 4, each of which is configured to sense the light emitted by the light emitting device 1. The processor 3 is configured to receive the sensed signals transmitted from the plurality of light sensors contained in the light receiving device 2 and determines whether the base substrate 4 is aligned accurately depending on whether the plurality of light sensors sense the light emitted from the light emitting device 1.

Specifically, if at least one light sensors contained in the light receiving device 2 fail to sense the light emitted from the light emitting device 1, the processor 3 determines that the base substrate 4 is not aligned accurately. If all light sensors contained in the light receiving device 2 sense the light emitted from the light emitting device 1, the processor 3 determines that the base substrate 4 is aligned accurately.

Furthermore, the processor 3 may be further configured to, when determining the base substrate 4 is not aligned accurately, determine an alignment direction and an alignment distance for which the base substrate 4 needs to be adjusted respectively according to the position and the number of light sensors that fail to sense light in the light receiving device 2. The alignment distance includes a horizontal distance and a vertical distance.

In practice, the alignment precision requirements on the base substrate 4 is very high. Therefore it's required to consider whether the base substrate 4 is rotated. There may be the following two methods for the processor 3 to determine whether the base substrate 4 is rotated.

(Method 1) For at least two alignment marks disposed on the base substrate 4, the processor 3 determines whether the base substrate 4 is rotated according to positions of light sensors that fail to sense light in the light receiving device 2 corresponding to the two alignment marks. An specific example is as follows. If a part of light sensors that fail to sense light in the light receiving device 2 corresponding to the two alignment marks are the same, the processor 3 determines that the base substrate 4 has not been rotated; if positions of light sensors that fail to sense light in the light receiving device 2 corresponding to the two alignment marks are different, the processor 3 determines that the base substrate 4 has been rotated.

(Method 2) For at least two alignment marks disposed on the base substrate 4, the processor 3 determines the maximum horizontal distance and the maximum vertical distance corresponding to each alignment mark respectively and determines whether the base substrate 4 is rotated according to the maximum horizontal distances and the maximum vertical distances corresponding to the two alignment marks. An specific example is as follows. If the maximum horizontal distances corresponding to the two alignment marks are equal, and the maximum vertical distances corresponding to the two alignment marks are equal, the processor 3 determines that the base substrate 4 has not been rotated; if the maximum horizontal distances corresponding to the two alignment marks are not equal, or the maximum vertical distances corresponding to the two alignment marks are not equal, the processor 4 determines that the base substrate 4 has been rotated.

Furthermore, after it is determined that the base substrate 4 has been rotated, the processor 3 proceeds the alignment processing as follows. The processor 3 determines an alignment angle according to the difference between maximum horizontal distances of the two alignment marks and the difference between maximum vertical distances of the two alignment marks. The processor 3 determines a compensation direction of the alignment angle according to positions of the light sensors that fail to sense light in the light receiving device 2 corresponding to the two alignment marks. After compensating the base substrate 4 according to the alignment angle and the compensation direction, for any alignment mark, the processor 3 determines an alignment direction and an alignment distance for which the base substrate 4 is to be adjusted respectively according to the position and the number of light sensors that fail to sense light in the light receiving device 2.

As a preferred example, if alignment marks 41 are opaque, and periphery of alignment marks 41 is transparent, then the end surface of the light receiving device 2 that faces each alignment mark 41 includes a first region at the center and a second region adjacent to the first region. The shape and size of the first region are the same as that of the alignment mark 41, while the second region consists of subregions respectively disposed around the rectangular region where the first region is located. All the light sensors are uniformly distributed in the second region and any two light sensors are disposed equidistantly.

In this way, the processor 3 determines an alignment direction and an alignment distance for which the base substrate 4 is to be adjusted respectively according to the position and the number of light sensors that fail to sense light in the light receiving device 2.

For example, the processor 3 determines the alignment direction is the direction opposite to the positions of light sensors that fail to sense the light emitted from the light emitting device 1 in the light receiving device 2.

In this implementation, a central light receiving device is further disposed at the central position of the first region and accordingly, the processor 3 may be used for the following scenarios for example. If all light sensors contained in the light receiving device 2 sense the light emitted from the light emitting device 1, and the central light receiving device contained in the light receiving device 2 fails to sense the light emitted from the light emitting device 1, it is determined that the base substrate 4 is aligned accurately. If all light sensors contained in the light receiving device 2 sense the light emitted from the light emitting device 1, and the central light receiving device contained in the light receiving device 2 senses light emitted from the light emitting device 1, it is determined that the base substrate 4 is not aligned accurately.

Refer to the above scheme I for specific details, which will not be described in detail any more here.

As another preferred implementation, if the alignment mark 41 is transparent and the periphery of the alignment mark 41 is opaque, the end surface of the light receiving device 2 that faces the alignment mark 41 includes a first region at the central position, which has a shape and size same as that of the alignment mark 41; all light sensors are uniformly distributed in the first region and any two light sensors are disposed equidistantly.

In this way, the processor 3 determines an alignment direction and an alignment distance for which the base substrate 4 is to be adjusted respectively according to the position and the number of light sensors that fail to sense light in outer region of the projection of a circumscribed rectangle of the alignment mark 41 onto the light receiving device 2.

Specifically, the processor 3 determines the alignment direction as a direction towards the positions of light sensors that fail to sense the light emitted from the light emitting device 1 in the light receiving device 2.

Refer to the above scheme II for specific details, which will not be described in detail any more here.

Preferably, the alignment mark is a cross-shaped alignment mark.

Preferably, the base substrate 4 is provided with one alignment mark in each of the two corner regions at diagonal positions.

In the present embodiment, furthermore, there may be the following several compensation approaches for example when compensating the base substrate 4:

(Approach I) The base substrate 4 is moved for compensation according to the determined alignment direction and alignment distance, and alignment marks on the base substrate 4 are located at corresponding standard positions after adjustment.

(Approach II) The operation to be implemented on the base substrate 4 at present is compensated, such as the mask being compensated, according to the determined alignment direction and alignment distance.

If the base substrate 4 has an angular deflection, a specific example for the above-mentioned approach I may include: rotating the base substrate 4 first according to the determined alignment angle and the alignment direction corresponding to the alignment angle; then moving the object to be aligned according to the determined alignment direction and alignment distance, and making the alignment marks on the base substrate 4 to be located at their corresponding standard positions after regulation. If the base substrate 4 has an angular deflection, a specific example for the above-mentioned approach II may be: rotating the base substrate 4 first according to the determined alignment angle and the alignment direction corresponding to the alignment angle; then compensating the operation that needs to be carried out for the base substrate 4 according to the determined alignment direction and alignment distance.

What are described above is related to the illustrative embodiments of the disclosure only and not limitative to the scope of the disclosure; the scopes of the disclosure are defined by the accompanying claims.

The invention claimed is:

1. An alignment system comprising a light emitting device, a light receiving device and a processor, wherein:
   the light emitting device is configured to be located on one side of an object to be aligned and to emit light towards the object to be aligned;
   the light receiving device is configured to be located on the other side of the object to be aligned and at a standard position corresponding to an alignment mark disposed on the object to be aligned, the light receiving device is provided with a plurality of light sensors, configured for sensing the light, on an end surface facing the object to be aligned;
   the processor is configured to receive sensing signals transmitted from each of the light sensors, if at least one of the light sensors contained in the light receiving device fails to sense the light emitted from the light emitting device, the processor determines that the object to be aligned is not aligned accurately;

if all of the light sensors contained in the light receiving device sense the light emitted from the light emitting device, the processor determines that the object to be aligned is aligned accurately;

wherein if the alignment mark is opaque, and periphery of the alignment mark is transparent, an end surface of the light receiving device that faces the alignment mark comprises a first region at a center and a second region adjacent to the first region, and the first region has a shape and a size same as that of the alignment mark;

wherein the second region consists of subregions disposed respectively around a rectangular region in which the first region is located.

2. The alignment system of claim 1, wherein if it is determined that the object to be aligned is not aligned accurately, the processor further determines an alignment direction and an alignment distance for which the object to be aligned needs to be adjusted respectively according to positions and number of the light sensors that fail to sense the light in the light receiving device, wherein the alignment distance comprises a horizon distance and a vertical distance.

3. The alignment system of claim 2, wherein for at least two of the alignment marks disposed on the object to be aligned, the processor determines whether the object to be aligned is rotated according to positions of the light sensors that fail to sense light in the light receiving device corresponding to the two alignment marks; or for at least two of the alignment marks disposed on the object to be aligned, the processor determines a maximum horizontal distance and a maximum vertical distance corresponding to each of the alignment marks respectively and determines whether the object to be aligned is rotated according to the maximum horizontal distances and the maximum vertical distances corresponding to the two alignment marks.

4. The alignment system of claim 3, wherein after determining the object to be aligned has been rotated, the processor determines an alignment angle according to a difference between maximum horizontal distances of the two alignment marks and a difference between maximum vertical distances of the two alignment marks; and the processor determines a compensation direction for the alignment angle according to positions of the light sensors that fail to sense the light in the light receiving device corresponding to the two alignment marks;

after compensating the object to be aligned according to the alignment angle and the compensation direction, for any of the alignment marks, the processor determines an alignment direction and an alignment distance for which the object to be aligned needs to be adjusted respectively according to positions and number of the light sensors that fail to sense the light in the light receiving device.

5. The alignment system of claim 1, wherein a central light receiving device is disposed at a central position of the first region, if all of the light sensors contained in the light receiving device sense the light, and the central light receiving device contained in the light receiving device fails to sense the light, the processor determines that the object to be aligned is aligned accurately;

if all of the light sensors contained in the light receiving device sense the light, and the central light receiving device contained in the light receiving device senses the light, the processor determines that the object to be aligned is not aligned accurately.

6. The alignment system of claim 1, wherein the processor determines the alignment direction of the object to be aligned is a direction opposite to positions of the light sensors that fail to sense the light emitted from the light emitting device in the light receiving device according to positions of the light sensors that fail to sense the light in the light receiving device.

7. An alignment system comprising a light emitting device, a light receiving device and a processor, wherein:

the light emitting device is configured to be located on one side of an object to be aligned and to emit light towards the object to be aligned;

the light receiving device is configured to be located on the other side of the object to be aligned and at a standard position corresponding to an alignment mark disposed on the object to be aligned, the light receiving device is provided with a plurality of light sensors, configured for sensing the light, on an end surface facing the object to be aligned;

the processor is configured to receive sensing signals transmitted from each of the light sensors, if at least one of the light sensors contained in the light receiving device fails to sense the light emitted from the light emitting device, the processor determines that the object to be aligned is not aligned accurately;

if all of the light sensors contained in the light receiving device sense the light emitted from the light emitting device, the processor determines that the object to be aligned is aligned accurately;

wherein if the alignment mark is transparent, and periphery of the alignment mark is opaque, an end surface of the light receiving device that faces the alignment mark comprises a first region at a center, and the first region has a shape and a size same as that of the alignment marks.

8. The alignment system of claim 7, wherein if it is determined that the object to be aligned is not aligned accurately, the processor further determines an alignment direction and an alignment distance for which the object to be aligned needs to be adjusted respectively according to positions and number of the light sensors that fail to sense the light in the light receiving device, wherein the alignment distance comprises a horizon distance and a vertical distance.

9. The alignment system of claim 8, wherein for at least two of the alignment marks disposed on the object to be aligned, the processor determines whether the object to be aligned is rotated according to positions of the light sensors that fail to sense light in the light receiving device corresponding to the two alignment marks; or for at least two of the alignment marks disposed on the object to be aligned, the processor determines a maximum horizontal distance and a maximum vertical distance corresponding to each of the alignment marks respectively and determines whether the object to be aligned is rotated according to the maximum horizontal distances and the maximum vertical distances corresponding to the two alignment marks.

10. The alignment system of claim 9, wherein after determining the object to be aligned has been rotated, the processor determines an alignment angle according to a difference between maximum horizontal distances of the two alignment marks and a difference between maximum vertical distances of the two alignment marks; and the processor determines a compensation direction for the alignment angle according to positions of the light sensors that fail to sense the light in the light receiving device corresponding to the two alignment marks;

after compensating the object to be aligned according to the alignment angle and the compensation direction, for any of the alignment marks, the processor determines an alignment direction and an alignment distance for which the object to be aligned needs to be adjusted respectively according to positions and number of the light sensors that fail to sense the light in the light receiving device.

11. The alignment system of claim 7, wherein the processor determines an alignment direction and an alignment distance for which the object to be aligned is to be adjusted respectively according to positions and number of the light sensors that fail to sense light in an outer region of a projection of a circumscribed rectangle of the alignment marks onto the light receiving device, and wherein the alignment distance comprises a horizon distance and a vertical distance.

12. The alignment system of claim 7, wherein the processor determines the alignment direction for the object to be aligned is a direction towards positions of the light sensors that fail to sense the light emitted from the light emitting device in the light receiving device.

* * * * *